(12) United States Patent
Ban

(10) Patent No.: US 11,244,963 B2
(45) Date of Patent: Feb. 8, 2022

(54) DISPLAY SUBSTRATE, DISPLAY PANEL AND DISPLAY DEVICE

(71) Applicant: BOE Technology Group Co., Ltd., Beijing (CN)

(72) Inventor: Shengguang Ban, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 36 days.

(21) Appl. No.: 16/915,040

(22) Filed: Jun. 29, 2020

(65) Prior Publication Data
US 2021/0005635 A1    Jan. 7, 2021

(30) Foreign Application Priority Data

Jul. 4, 2019    (CN) .......................... 201910600466.8

(51) Int. Cl.
*H01L 27/12*    (2006.01)

(52) U.S. Cl.
CPC ................................ *H01L 27/1218* (2013.01)

(58) Field of Classification Search
CPC ......... H01L 27/1218; H01L 2251/5338; H01L 2227/326; H01L 51/0097; H01L 27/3244; G09F 9/301; G09F 9/33; Y02E 10/549
See application file for complete search history.

(56) References Cited

U.S. PATENT DOCUMENTS

| 2018/0052493 A1 | 2/2018 | Hong et al. | |
| 2020/0243778 A1* | 7/2020 | Li | ....................... H01L 27/3276 |

FOREIGN PATENT DOCUMENTS

| CN | 108389884 A | 8/2018 |
| CN | 109036147 A | 12/2018 |
| CN | 109346504 A | 2/2019 |
| CN | 109599402 A | 4/2019 |
| CN | 109830614 A | 5/2019 |
| CN | 109860245 A | 6/2019 |
| CN | 109935730 A | 6/2019 |

OTHER PUBLICATIONS

First Office Action dated Dec. 28, 2020, for corresponding Chinese application No. 201910600466.8.

* cited by examiner

*Primary Examiner* — Kevin Quarterman
(74) *Attorney, Agent, or Firm* — Nath, Goldberg & Meyer; Joshua B. Goldberg

(57) ABSTRACT

The present disclosure provides a display substrate, a display panel and a display device, and belongs to the field of display technology. The display substrate includes a plurality of display islands and a plurality of connection parts; any two adjacent display islands are connected through one of the plurality of connection parts; the plurality of connection parts define a plurality of openings of a base substrate of the display substrate; at least part of the plurality of openings is provided therein with a torsional structure, the torsional structure is connected between two connection parts of connection parts defining the opening in which the torsional structure is located, the two connection parts extending in substantially a same direction; and the torsional structure is stretchable in a direction in which it is connected with the two connection parts.

17 Claims, 4 Drawing Sheets

DISPLAY SUBSTRATE, DISPLAY PANEL AND DISPLAY DEVICE

CROSS-REFERENCE TO RELATED APPLICATION

This application claims priority to Chinese Patent Application No. 201910600466.8, filed on Jul. 4, 2019, the entire contents of which are hereby incorporated by reference.

TECHNICAL FIELD

The present disclosure relates to the field of display technology, and particularly, to a display substrate, a display panel, and a display device.

BACKGROUND

Flexible display devices are considered to be the mainstream of next-generation displays and have attracted extensive attention due to their advantages such as bendability, good impact resistance, strong shock resistance, light weight, small size and easy portability. With the development of flexible display technology, display panels tend to be stretchable.

However, in an existing stretchable display substrate, when the stretching force is large, the normal display of the stretched display panel may be affected, affecting the display effect.

SUMMARY

In an aspect, embodiments of the present disclosure provide a display substrate, including: a plurality of display islands and a plurality of connection parts; any two adjacent display islands are connected through one of the plurality of connection parts; the plurality of connection parts define a plurality of openings of a base substrate of the display substrate; at least part of the plurality of openings is provided therein with a torsional structure, the torsional structure is connected between two connection parts of connection parts defining the opening in which the torsional structure is located, the two connection parts extending in substantially a same direction; and the torsional structure is stretchable in a direction in which it is connected with the two connection parts.

In some embodiments, for every four display islands adjacent in a first direction and a second direction perpendicular to the first direction, four connection parts connect the four display islands and define one of the plurality of openings of the base substrate.

In some embodiments, the torsional structure is connected between two connection parts of the four connection parts defining the opening in which the torsional structure is located, the two connection parts extending in substantially a same direction and having a shorter distance therebetween than a distance between the other two connection parts of the four connection parts.

In some embodiments, a width-to-height ratio of the torsional structure ranges from 1:5 to 1:1.5.

In some embodiments, the torsional structure has a shape of a symmetrical figure.

In some embodiments, the symmetrical figure is arc-shaped; and the width-to-height ratio of the symmetrical figure ranges from 1:3 to 1:1.5.

In some embodiments, the symmetrical figure is an ellipse ring or an S shape; and a width-to-height ratio of the symmetrical figure ranges from 1:5 to 1:3.

In some embodiments, the torsional structure is connected between intermediate positions of the two connection parts extending in substantially a same direction among the connection parts defining the opening in which the torsional structure is located.

In some embodiments, the torsional structure and the connection parts connected thereto are formed as a single piece.

In some embodiments, the display substrate includes a flexible substrate; and the torsional structure and the flexible substrate are formed as a single piece.

In some embodiments, the plurality of display islands are arranged in an array.

In some embodiments, the opening is I-shaped; the torsional structure is connected between two connection parts that define a vertical portion of the I-shaped opening.

In some embodiments, the torsional structure is connected between intermediate positions of the two connection parts that define the vertical portion of the I-shaped opening.

In some embodiments, the torsional structure is formed in each of the plurality of openings.

In some embodiments, the torsional structure is formed in only a part of the plurality of openings, and in a same direction, torsional structures are provided at an interval not exceeding four openings.

In another aspect, an embodiment of the present disclosure provides a display panel, including any one of the above display substrates.

In still another aspect, an embodiment of the present disclosure provides a display device, including any one of the above display panels.

DETAILED DESCRIPTION

In order to enable those skilled in the art to better understand the technical solutions of the present disclosure, the present disclosure will be described in further detail below with reference to the accompanying drawings and specific implementations.

Figure 3:
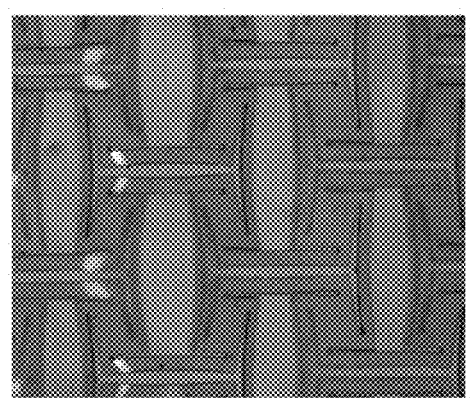
FIG. 3 is a schematic diagram of a display substrate in a stretching state in the related art.

As shown in FIG. 3, in an existing stretchable display substrate, a base substrate is a patterned flexible substrate, the patterned substrate includes a plurality of display islands and a plurality of connection bridges, and two adjacent display islands are connected by a connection bridge, and thus stretchability is achieved by the deformation of the display islands and the openings between the connection bridges.

The inventor found that in the existing stretchable display substrate, when the stretching force is large, some display islands may be twisted to some extent due to the stretching (part of the edge areas of the display islands protrudes from the original overall plane of the stretchable display substrate), that is, Z-axis deformation occurs. As the stretching force increases, the Z-axis deformation becomes more obvious, which affects the normal display of the stretchable display panel.

Figure 1:
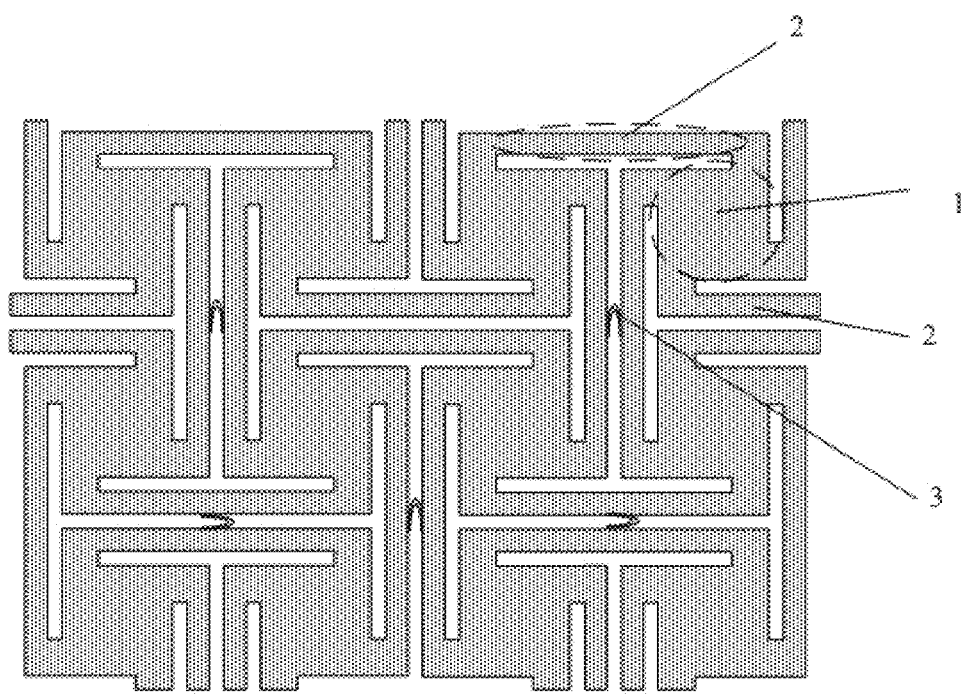
FIG. 1 is a schematic structural diagram of a display substrate according to an embodiment of the present disclosure.
Figure 2:
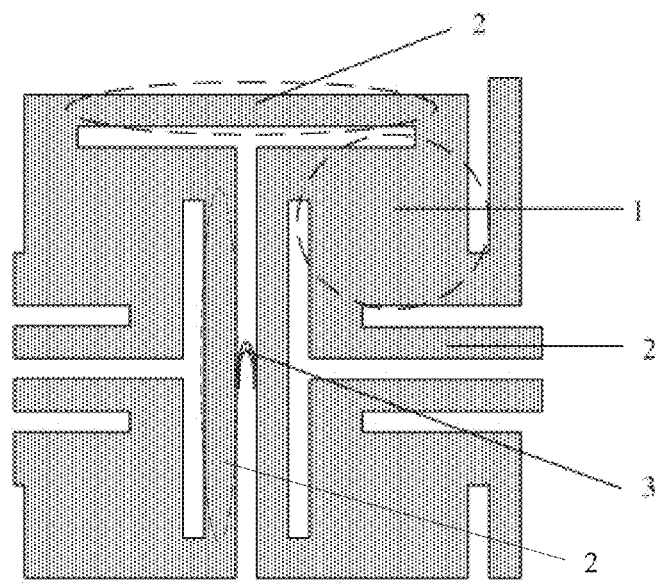
FIG. 2 is an enlarged schematic diagram of a partial structure of a display substrate according to an embodiment of the present disclosure.

Embodiments of the present disclosure provide a display substrate, which is particularly suitable for a stretchable display substrate. As shown in FIGS. 1 and 2, the display substrate includes: a plurality of display islands 1 and a plurality of connection parts 2; any two adjacent display islands 1 are connected through the connection part 2. The plurality of connection parts 2 define a plurality of openings of the base substrate of the display substrate, and at least part of the plurality of openings is provided with a torsional structure 3. The torsional structure 3 is connected between two connection parts extending in substantially a same direction among connection parts that define the opening where the torsional structure is located, and the torsional structure is stretchable in a direction in which it is connected with the two connection parts.

In an embodiment, the torsional structure 3 is connected between the two connection parts that extend in substantially a same direction and have a relatively smaller distance therebetween among the connection parts that define the opening where the torsional structure is located. For example, for any four display islands 1 adjacent in a first direction and adjacent in a second direction among the plurality of display islands, four connection parts 2 connect the four display islands and define one of the opening of the base substrate. At least part of the plurality of openings of the base substrate is provided with a torsional structure 3, the torsional structure 3 is connected with two connection parts 2 extending in a same direction and having a smaller distance therebetween among the four connection parts 2, and the torsional structure 3 is stretchable in its connection direction with the two connection parts 2.

The display substrate provided in the embodiment may include: a base substrate, and devices on the base substrate such as display units, signal lines, etc. The base substrate is a patterned substrate, and has a plurality of display islands 1 and a plurality of connection parts 2, and the plurality of connection parts 2 define a plurality of openings. Therefore, it can also be considered as that a plurality of openings divide the base substrate into a plurality of display islands 1 and a plurality of connection parts 2. One or more display units are provided in the display island 1, and each display unit may include devices such as an OLED device, a driving transistor, and the like. Signal lines are provided in the connection parts 2 to connect the display units in respective display islands 1, so as to supply control signals to the display units through the signal lines to control the operation of the display substrate.

When the display substrate is stretched, deformation of each opening (opening defined by the connection parts 2) on the base substrate is adapted to the stretching of the display substrate. When the stretching force received by the display substrate is large, Z-axis deformation occurs to the display island 1 as the deformation of the opening of the base substrate increases. As the stretching force increases, the Z-axis deformation becomes more obvious, which affects the normal display of the stretchable display panel.

It should be noted that the deformation direction of the opening is related to the direction of the stretching force, and the opening is defined by the connecting parts 2. In the embodiments of the present disclosure, the torsional structure 3 is provided between two connection parts 2, and the torsional structure 3 is stretchable in the connection direction, so that stretching of the base substrate can be realized, and when the stretching force is large, excessive stretching of the display substrate can be restricted to a certain extent, degree of the Z-axis deformation of the display island 1 can be suppressed, and thus problems of display defects of the stretchable display substrate caused by the large stretching force can be avoided as much as possible.

In some embodiments, the plurality of display islands 1 may be arranged according to a certain rule, and two adjacent display islands 1 are connected by a connection part 2. For example, as shown in FIG. 1, the plurality of display islands 1 are arranged in an array, and each display island 1 is connected to another display island 1 adjacent thereto in a row direction or a column direction through the connection part 2. In this case, the first direction may be the row direction of the array, and the second direction may be the column direction of the array.

As shown in FIGS. 1 and 2, any two display islands 1 adjacent in the row direction are connected by one connection part 2; any two display islands 1 adjacent in the column direction are connected by one connection part 2. That is to say, any four display islands 1 in two adjacent rows and two adjacent columns are connected by four connection parts 2. In the embodiment, the four connection parts 2 define an opening of the base substrate.

It could be understood that the plurality of display islands 1 in the embodiment may also be arranged in other manners, such as in an annular arrangement (e.g., a plurality of annular display islands each including a plurality of display islands 1), and the like. The shape of the opening defined by the four connection parts 2 may be determined according to the connection position of each connection part 2 with respective display islands 1. Specifically, the opening may be I-shaped, T-shaped or have other shapes, which will not be described in detail herein.

In order to explain the display substrate of the present embodiments more clearly, a case in which the plurality of display islands 1 are arranged in an array, and the opening defined by the four connection parts 2 is I-shaped is taken as an example for description.

As shown in FIG. 2, when the opening defined by the four connection parts 2 is I-shaped, the connection parts 2 and the display islands 1 may be connected as follows: each display island 1 other than the display island 1 on the edge is connected with four display islands 1 adjacent thereto in the row direction or in the column direction respectively through four connection parts 2, the connection position of each of the four connection parts 2 with the display island 1 is on a side of the display island 1 away from its adjacent display island 1 connected through the connection part 2, and the four connection parts 2 connected to a same display island 1 are independent of each other and do not overlap.

Therefore, the two display islands 1 adjacent in the row direction is connected to the connection part 2 in a symmetric manner, and two display islands 1 adjacent in the column direction is connected to the connection part 2 in a symmetric manner. As shown in FIG. 2, in the four display islands 1 in two adjacent rows and two adjacent columns, two connection parts 2 each connecting two display islands 1 adjacent in the row direction and two connection parts 2 each connecting two display islands 1 adjacent in the column direction define an I-shaped opening. Specifically, two display islands 1 in the first row are connected by a connection part 2 extending in the row direction, two display islands 1 located in the second row are connected by a connection part 2 extending in the row direction (not shown in FIG. 2, and referring to FIG. 1), two display islands located in the first column are connected by a connection part 2 extending in the column direction, and two display islands located in the second column are connected by a connection part 2 extending in the column direction, and the four connection parts 2 define an I-shaped opening. The I-shaped opening may be provided therein with a torsional structure 3, and the torsional structure is connected between two connection parts 2 extending in a same direction and having a smaller distance therebetween among the four connection parts, that is, between two connection parts 2 each connecting two display islands 1 located in a same column (i.e., two connection parts 2 extending in the column direction), and the torsional structure 3 is stretchable in the connection direction with the connection parts 2.

It could be understood that, in order to clearly show the arrangement of the openings and the torsional structures 3 in the openings, FIGS. 1 and 2 only schematically show general areas in which the connection parts 2 and the display islands 1 are respectively located, but do not show signal lines that actually connect two adjacent display islands 1 in the connection part 2 or the specific connection between the signal lines and the display islands 1. It should be noted that although the areas where the four connection parts 2 are located are not clearly shown as being separated from each other in FIGS. 1 and 2, in practical implementation, the four connection parts 2 connecting the four display islands 1 in adjacent rows and adjacent columns may be separated from each other. Needless to say, it can be understood that the solution of dividing a base substrate into a plurality of display islands 1 and a plurality of connection parts 2 by a plurality of I-shaped openings on the flexible substrate may also refer to other technical solutions in the related art, which will not be repeated in detail herein.

In the embodiments, when the opening defined by the four connection parts 2 is I-shaped, the torsional structure 3 is connected to the two connection parts 2 that define the middle part of the I-shaped opening. That is, as shown in FIGS. 1 and 2, the torsional structure 3 connects the two connection parts 2 that define the "1" portion (i.e., the vertical portion of the I-shaped opening, which extends in a second direction and has a larger length than a portion of the I-shaped opening extending in a first direction perpendicular to the second direction) of the I-shaped opening. In a case where the opening defined by the four connection parts 2 is I-shaped, when the display substrate is stretched, the two connection parts 2 that define the "I" portion of the I-shaped opening are more likely to deform than the other two connection parts 2, That is, the "I" portion of the I-shaped opening is easier to deform under the same stretching force. By connecting the two connection parts 2 that define the middle part of the I-shaped opening through the torsional structure 3, the torsional structure 3 can effectively suppress excessive deformation of the I-shaped opening, thereby avoiding the problem of display defects caused by the excessive deformation. Because deformation of the other two connection parts 2 defining the "-" portions in the I-shaped opening (i.e., horizontal portions of the I-shaped opening, each of which extends in the first direction and has a smaller length than the portion of the I-shaped opening extending in the second direction) is not large during stretching, the torsional structure 3 may not be provided between the two connection parts 2.

In some embodiments, in order to further improve the stretchability of the display substrate and achieve good stretchability of the display substrate in both row and column directions, a plurality of I-shaped openings whose "1" portions (i.e., vertical portion) extend respectively along the row direction (e.g., horizontal direction) or column direction (e.g., vertical direction) may be formed. As shown in FIGS. 1 and 2, a plurality of I-shaped openings whose "1" portions extend along the row direction and a plurality of I-shaped openings whose "1" portions extend along the column direction are alternately arranged in both the row direction and the column direction. In this way, when stretching the display substrate, good stretchability can be achieved in both row and column directions. The I-shaped openings whose "1" portions (i.e., vertical portion) extend along different directions may have a same structure, which is not repeatedly described herein.

Figure 4:
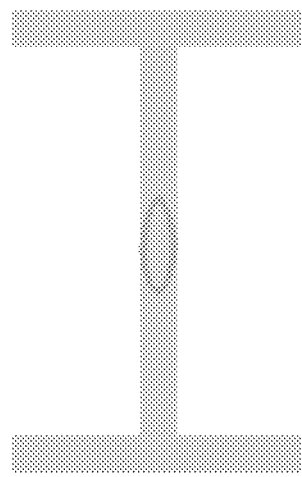
FIG. 4 is a schematic diagram of a torsional structure according to an embodiment of the present disclosure.
Figure 5:
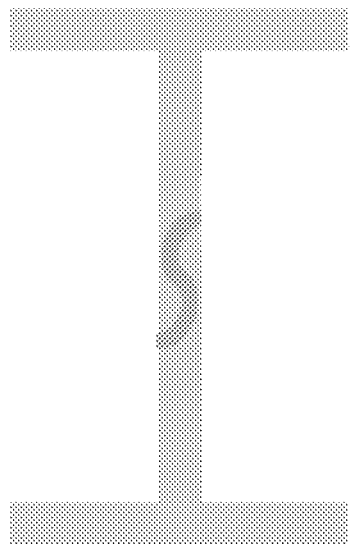
FIG. 5 is a schematic diagram of another torsional structure according to an embodiment of the present disclosure.

In the embodiments of the present disclosure, the shape of the torsional structure 3 may be a curve. In some embodiments, the torsional structure 3 is in the shape of a symmetrical figure such as an arc, an ellipse (as shown in FIG. 4), an S-shape (as shown in FIG. 5), etc., which is not particularly limited in the present disclosure, as long as the torsional structure 3 is stretchable in the connection direction with the connection parts 2. It could be understood that the torsional structure 3 has a certain stretchability, and it is subjected to a stretching force during the stretching of the display substrate, and by designing its shape as a symmetrical figure, the torsional structure 3 can better adapt to the stretching force, so as to avoid the occurrence of undesirable phenomena such as breakage caused by excessive stretching force.

In some embodiments, the width-to-height ratio of the torsional structure 3 is in the range of 1:5 to 1:1.5. It should be noted that in the embodiments, the width of the torsional structure 3 refers to its maximum width, and the height thereof refers to the length of the area occupied by the torsional structure 3. For any torsional structure 3, its width and height can be measured by the following method: placing the torsional structure 3 in the smallest rectangle that can accommodate the torsional structure 3, and taking the width and length of the rectangle as the width and height of the torsional structure 3. For example, the width of the torsional structure 3 shown in FIG. 2 is the length of the torsional structure 3 in the row direction, and the height thereof is the length of the torsional structure 3 in the column direction.

In some embodiments, the torsional structure 3 is in the shape of an arc. In this case, the width-to-height ratio of the torsional structure 3 may be in the range of 1:3 to 1:1.5. It has been proved by relevant experiments that the torsional structure 3 having the width-to-height ratio in the range of 1:3 to 1:1.5 has less influence on the stretchability of the display substrate and more obvious suppressing effect on Z-axis deformation of the display substrate, and can thus significantly improve the display effect of the display panel.

It should be noted that the arc in the present disclosure refers to a single arc including only one curved portion.

In some embodiments, as shown in FIGS. 4 and 5, the torsional structure 3 in the embodiments may be in the shape of an ellipse ring or an S shape. In this case, the width-to-height ratio of the ellipse ring or the S-shape may be in the range of 1:5 to 1:3.

It should be noted here that the torsional structure 3 in the shape of an ellipse ring may also be regarded as one pair of arc-shaped torsional structures 3 that are symmetric (axisymmetric), and the torsional structure 3 in the S shape may also be regarded as one pair of arc-shaped torsional structure 3 that are symmetric (centrosymmetric). It has been proved by relevant experiments that when the torsional structure 3 is in the shape of an ellipse ring or an S-shape, and its width-to-height ratio is in the range of 1:5 to 1:3, the torsional structure 3 has less effect on the stretchability of the display substrate, and strengthened suppressing effect on the Z-axis deformation, which can significantly improve the display effect of the display panel.

In some embodiments, the torsional structure 3 is connected between the intermediate positions of the two connection parts 2. When stretching the display substrate, the intermediate region of the opening formed by the connection parts 2 has the largest deformation, and the torsional structure 3 is connected with the middle of each of the two connection parts 2 that define the opening, that is, the torsional structure 3 is approximately located in the middle region of the opening, so that the suppressing effect on the Z-axis deformation of the display substrate is more obvious. For example, as shown in FIGS. 1 and 2, the torsional structure 3 is connected with the middle of each of the connection parts 2 that defines the vertical portion of the I-shaped opening.

In the display substrate of the embodiments, the torsional structure 3 may be formed in each opening; alternatively, the torsional structure 3 may be provided in only part of the openings, so as not to increase the complexity of the manufacturing process of the display substrate. For example, in a same direction (in the row direction or column direction), the torsional structures 3 are provided at an interval not exceeding four openings.

The torsional structure 3 may be formed with the connection parts 2 connected thereto as a single piece, in other words, the torsional structure 3 may have the same structure as the connection parts 2. With this configuration, the manufacturing process of the display substrate can be simplified as much as possible, and the connection of the torsional structure 3 with the connection parts 2 is good.

Figure 6:
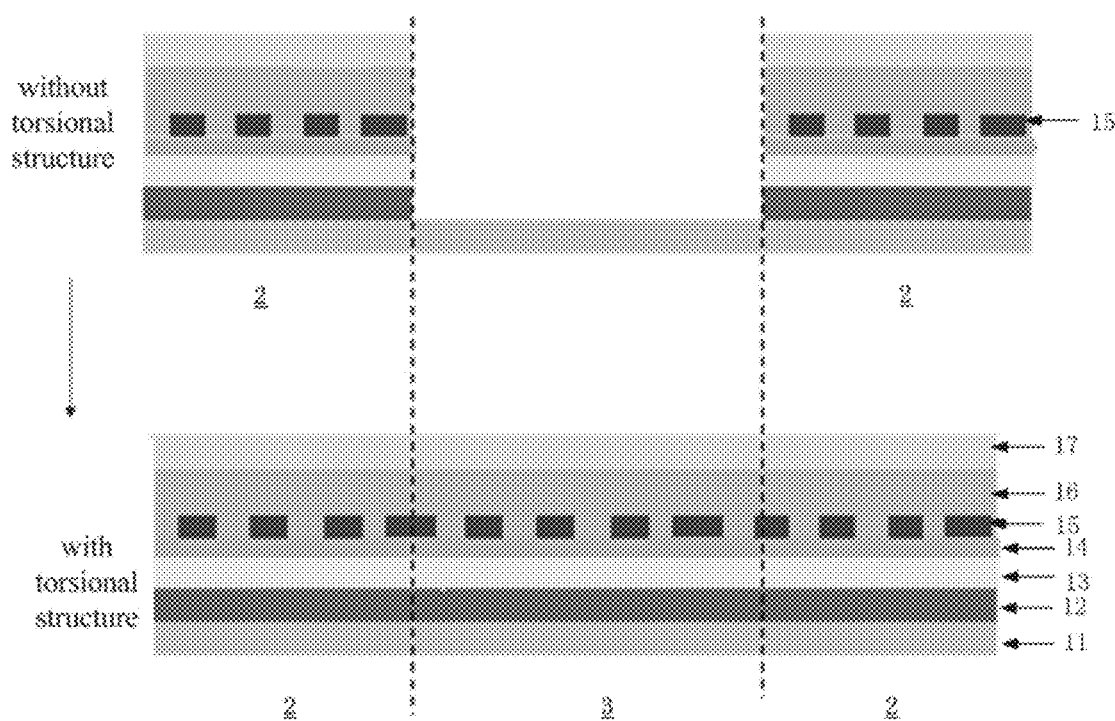
FIG. 6 is a schematic structural diagram of an opening and connection parts according to an embodiment of the present disclosure, in which a structure of the opening provided with the torsional structure and a structure of the opening without the torsional structure are respectively shown.

In an embodiment, as shown in FIG. 6, the connection part 2 may include a glass substrate (which will be removed later) 11, a flexible substrate 12, a barrier layer 13, a buffer layer 14, a first conductive layer (in a same layer as the source and drain electrodes of the thin film transistor) 15, a planarization layer 16, a second conductive layer 17, and other layers. The material of the flexible substrate 12 may include polyimide, and the thickness of the flexible substrate 12 may range from 5 μm to 15 μm. The barrier layer 13 and the buffer layer 14 each may be stacked film layers made of $SiN_x$ and/or $SiO_2$, with a total thickness ranging from 1500 Å to 8500 Å. The material of the first conductive layer 15 may be Ti/Al/Ti alloy, and the thickness thereof may range from 4000 Å to 9000 Å. The planarization layer 16 may be made of a resin material and have a thickness in the range of 1 μm to 2 μm. The second conductive layer 17 may have a thickness in the range of 500 Å to 2500 Å.

Figure 7:
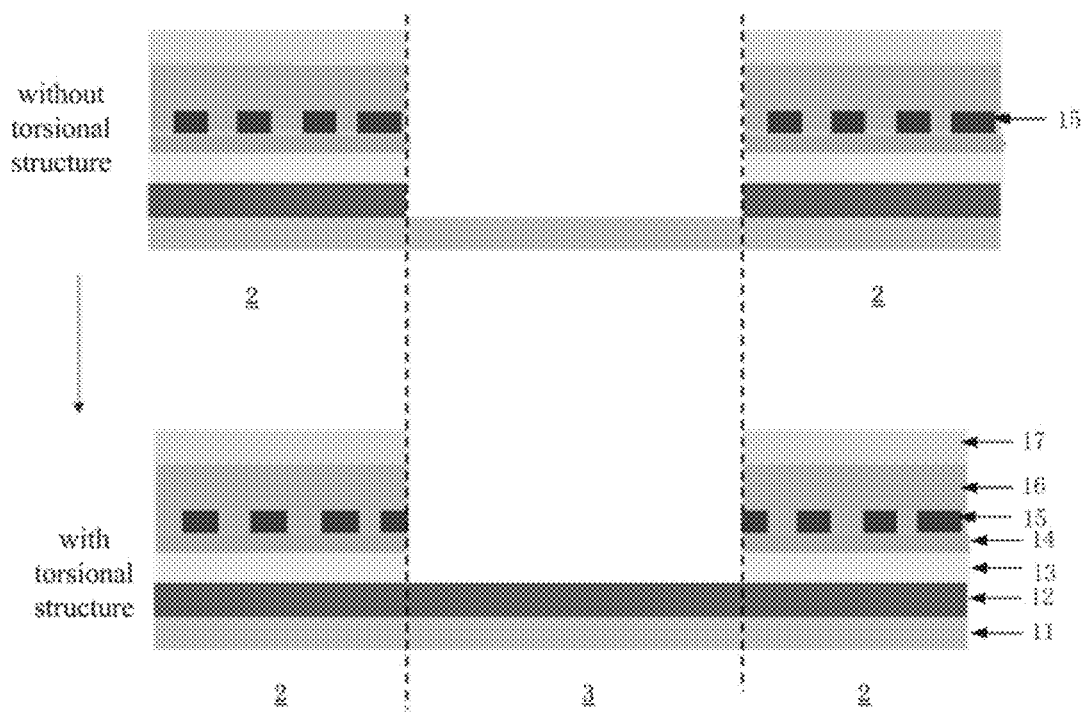
FIG. 7 is another schematic structural diagram of an opening and connection parts according to an embodiment of the present disclosure, in which a structure of the opening provided with the torsional structure and a structure of the opening without the torsional structure are respectively shown.

In an embodiment, as shown in FIG. 7, the torsional structure may be formed with only the flexible substrate 12 as a single piece, that is, the torsional structure only includes the flexible substrate 12, so as to be connected with the connection parts through the flexible substrate. Needless to say, the torsional structure may also be formed with the flexible substrate and partial layer(s) in the connection part 2 as a single piece, which is not limited in the embodiment.

In another aspect, an embodiment of the present disclosure further provides a display panel, including any one of the display substrates provided in the above embodiments. The display panel provided in the embodiment may be a stretchable display panel, which can be used in any product or component with a display function such as an electronic paper, a mobile phone, a tablet computer, a TV, a monitor, a notebook computer, a digital photo frame, a navigator, etc. Since the display panel in the embodiment includes the display substrate of the present disclosure, the display panel can still achieve good display effect in a stretched state.

In still another aspect, an embodiment of the present disclosure further provides a display device, including the display panel of the present disclosure.

The display device provided in the embodiment may be any product or component with a display function such as an electronic paper, a mobile phone, a tablet computer, a TV, a monitor, a notebook computer, a digital photo frame, a navigator, etc. Since the display device in the embodiment includes the display panel of the present disclosure, the display device can still achieve good display effect in a stretched state.

It could be understood that the above implementations are merely exemplary implementations employed to explain the principle of the present disclosure, but the present disclosure is not limited thereto. Various modifications and improvements can be made by those skilled in the art without departing from the spirit and scope of the present disclosure, and such modifications and improvements are also considered to be within the protection scope of the present disclosure.

What is claimed is:

1. A display substrate, comprising:
   a plurality of display islands and a plurality of connection parts; any two adjacent display islands being connected through one of the plurality of connection parts, wherein
   the plurality of connection parts define a plurality of openings of a base substrate of the display substrate;
   at least part of the plurality of openings is provided therein with a torsional structure, the torsional structure is connected between two connection parts of connection parts defining the opening in which the torsional structure is located, the two connection parts extending in substantially a same direction; and
   the torsional structure is stretchable in a direction in which it is connected with the two connection parts.

2. The display substrate of claim 1, wherein for every four display islands adjacent in a first direction and a second direction perpendicular to the first direction, four connection parts connect the four display islands and define one of the plurality of openings of the base substrate.

3. The display substrate of claim 2, wherein the torsional structure is connected between two connection parts of the four connection parts defining the opening in which the torsional structure is located, the two connection parts extending in substantially a same direction and having a shorter distance therebetween than a distance between the other two connection parts of the four connection parts.

4. The display substrate of claim 1, wherein a width-to-height ratio of the torsional structure ranges from 1:5 to 1:1.5.

5. The display substrate of claim 1, wherein the torsional structure has a shape of a symmetrical figure.

6. The display substrate of claim 5, wherein the symmetrical figure is arc-shaped; and a width-to-height ratio of the symmetrical figure ranges from 1:3 to 1:1.5.

7. The display substrate of claim 5, wherein the symmetrical figure is an ellipse ring or an S shape; and a width-to-height ratio of the symmetrical figure ranges from 1:5 to 1:3.

8. The display substrate of claim 1, wherein the torsional structure is connected between intermediate positions of the two connection parts extending in substantially a same direction among the connection parts defining the opening in which the torsional structure is located.

9. The display substrate of claim 1, wherein the torsional structure and the connection parts connected thereto are formed as a single piece.

10. The display substrate of claim 1, wherein the display substrate comprises a flexible substrate; and the torsional structure and the flexible substrate are formed as a single piece.

11. The display substrate of claim 1, wherein the plurality of display islands are arranged in an array.

12. The display substrate of claim 1, wherein the opening is I-shaped; and
the torsional structure is connected between two connection parts that define a vertical portion of the I-shaped opening.

13. The display substrate of claim 12, wherein the torsional structure is connected between intermediate positions of the two connection parts that define the vertical portion of the I-shaped opening.

14. The display substrate of claim 1, wherein the torsional structure is formed in each of the plurality of openings.

15. The display substrate of claim 1, wherein the torsional structure is formed in only a part of the plurality of openings, and in a same direction, torsional structures are provided at an interval not exceeding four openings.

16. A display panel, comprising the display substrate of claim 1.

17. A display device, comprising the display panel of claim 16.

* * * * *